(12) United States Patent
Anderson et al.

(10) Patent No.: US 10,678,294 B2
(45) Date of Patent: Jun. 9, 2020

(54) CLOCK FOR RECORDING DEVICES

(71) Applicant: SOUND DEVICES, LLC, Reedsburg, WI (US)

(72) Inventors: Matt Anderson, Baraboo, WI (US); Francois Morin, Reedsburg, WI (US)

(73) Assignee: SOUND DEVICES, LLC, Reedsburg, WI (US)

( * ) Notice: Subject to any disclaimer, the term of this patent is extended or adjusted under 35 U.S.C. 154(b) by 342 days.

(21) Appl. No.: 15/729,782

(22) Filed: Oct. 11, 2017

(65) Prior Publication Data

US 2018/0107239 A1  Apr. 19, 2018

Related U.S. Application Data

(60) Provisional application No. 62/408,431, filed on Oct. 14, 2016.

(51) Int. Cl.
| | |
|---|---|
| G06F 1/04 | (2006.01) |
| G06F 1/12 | (2006.01) |
| H03L 7/099 | (2006.01) |
| H03L 7/093 | (2006.01) |
| H03J 7/06 | (2006.01) |
| H04L 7/00 | (2006.01) |
| H03L 7/089 | (2006.01) |
| H03L 7/16 | (2006.01) |
| H04Q 9/00 | (2006.01) |
| G04G 3/00 | (2006.01) |

(52) U.S. Cl.
CPC ............. *G06F 1/04* (2013.01); *G04G 3/00* (2013.01); *G06F 1/12* (2013.01); *H03J 7/065* (2013.01); *H03L 7/089* (2013.01); *H03L 7/093* (2013.01); *H03L 7/0992* (2013.01); *H03L 7/16* (2013.01); *H04L 7/0004* (2013.01); *H04Q 9/00* (2013.01)

(58) Field of Classification Search
None
See application file for complete search history.

(56) References Cited

U.S. PATENT DOCUMENTS

| | | | |
|---|---|---|---|
| 5,416,510 A | 5/1995 | Lipton et al. | |
| 6,067,411 A | 5/2000 | Poimboeuf et al. | |
| 6,574,225 B2 | 6/2003 | Reynolds et al. | |
| 6,973,145 B1 | 12/2005 | Smith et al. | |
| 8,767,778 B2 | 7/2014 | Briscoe et al. | |
| 8,842,854 B1 | 9/2014 | Sanders et al. | |
| 9,829,912 B2 * | 11/2017 | Manabe | G06F 1/12 |
| 2003/0062959 A1 * | 4/2003 | Tsuda | H03L 7/1976 331/17 |
| 2012/0320268 A1 * | 12/2012 | Brouillette | H04N 5/06 348/500 |

(Continued)

*Primary Examiner* — Fahmida Rahman
(74) *Attorney, Agent, or Firm* — Foley & Lardner LLP

(57) ABSTRACT

A method includes receiving, by a recording device, an indication of an initializing time and receiving, by the recording device, an indication of a timing pace. The method also includes maintaining, by the recording device, an updated current time based on the initializing time and the timing pace and sensing, via a sensor of the recording device, a condition. The method further includes storing, in memory of the recording device, an indication of the condition and an associated indication of the updated current time. The indication of the updated current time corresponds to when the condition was sensed by the sensor.

15 Claims, 10 Drawing Sheets

(56) References Cited

U.S. PATENT DOCUMENTS

2015/0049248 A1\* 2/2015 Wang .................... H04L 65/602
                                                        348/512
2015/0074704 A1   3/2015 Kitazato \* cited by examiner

CLOCK FOR RECORDING DEVICES

CROSS REFERENCE TO RELATED APPLICATION

This application claims priority to U.S. Provisional Application 62/408,431, filed Oct. 14, 2016, incorporated by reference in its entirety.

BACKGROUND

The following description is provided to assist the understanding of the reader. None of the information provided or references cited is admitted to be prior art. In many instances, multiple recording devices are used to capture various aspects of a scene. For example, a movie set may include multiple video recorders and sound recorders. A system can be used to keep the various recording devices synched in time with each other.

SUMMARY

An illustrative recording device includes a sensor configured to sense a condition and memory configured to store an indication of the condition and an indication of when the condition was sensed by the sensor. The recording device also includes a timing circuit that is configured to receive an indication of an initializing time and receive an indication of a timing pace. The timing circuit is further configured to maintain an updated current time based on the initializing time and the timing pace. The recording device also includes a processor communicatively coupled to the sensor, the memory, and the timing circuit. The processor is configured to receive from the sensor the indication of the condition and receive from the timing circuit an indication of the updated current time. The indication of the updated current time corresponds to when the condition was sensed by the sensor. The processor is further configured to cause the memory to store the indication of the condition and the indication of when the condition was sensed by the sensor.

An illustrative method includes receiving, by a recording device, an indication of an initializing time and receiving, by the recording device, an indication of a timing pace. The method also includes maintaining, by the recording device, an updated current time based on the initializing time and the timing pace and sensing, via a sensor of the recording device, a condition. The method further includes storing, in memory of the recording device, an indication of the condition and an associated indication of the updated current time. The indication of the updated current time corresponds to when the condition was sensed by the sensor. In some instances, the sensor is configured to sense the condition by capturing an image or detecting an audio signal The foregoing summary is illustrative only and is not intended to be in any way limiting. In addition to the illustrative aspects, embodiments, and features described above, further aspects, embodiments, and features will become apparent by reference to the following drawings and the detailed description.

Figure 1:
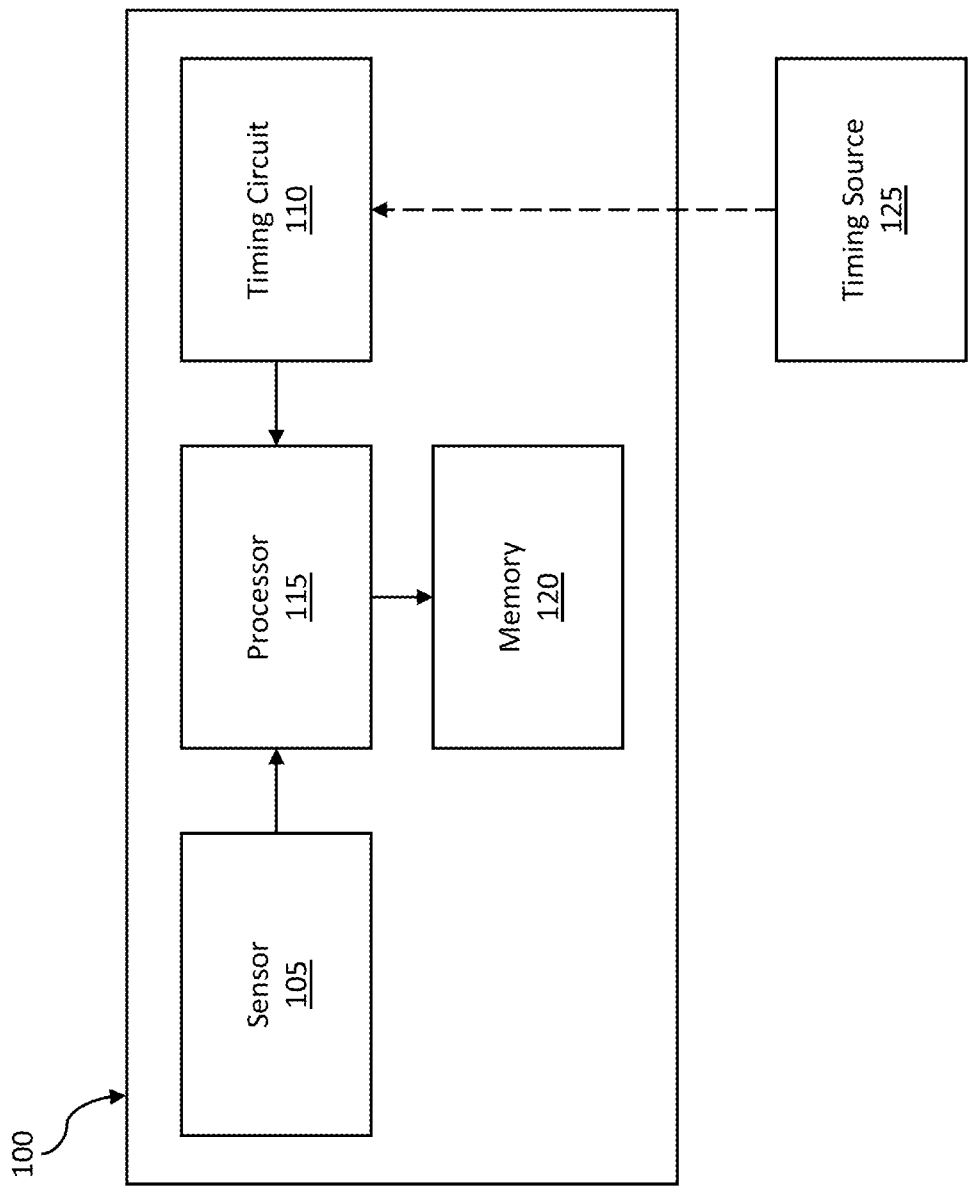
FIG. 1 is a block diagram of a recording system in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Recording an event often includes using multiple devices to capture the event. For example, multiple video recorders and audio recorders are used on movie and television production sets, radio or podcast recording studios, sports event stadiums, etc. The video or audio recordings of the event can be time-synchronized to assist in editing and splicing the various recordings together. For example, two video cameras can be used to capture different views of a movie scene. Each of the cameras can store the respective recorded video with a time signal that indicates the relative time that each frame was captured. While editing the final movie product, the editor may wish to switch from the view recorded by one camera to another while maintaining continuity of the scene. The time signal that was stored with each of the video recordings can be used to ensure that there is not a missing time gap or an overlap in time when switching from one view to the other.

In another example, a video camera can be used to record video, and a microphone device or audio recorder can be used to record sound. The video camera and the microphone device can each store the recorded content with a time signal. The time signal can be used to match up the sound recording with the video recording such that when a final product (e.g., a movie) is replayed with the video and the sound, the video and sound are replayed to reproduce the scene captured. For example, the speech sounds from an actor match up with the mouth movements of the actor.

In some instances, external timing devices are attached to each recording device while the recording devices are recording content. The external timing devices can each produce a signal that indicates the same time. That is, the external timing devices maintain a time signal that does not deviate from a predetermined timing pace. The external timing device of each recording device communicates with recording device to maintain the predetermined timing pace in the recording device. Thus, the external timing device can be used to ensure that each of the multiple recording devices maintains the same time signal such that the recorded content (e.g., video or sound) can be lined up with one another when the recordings are combined.

However, using external timing devices may not be the most efficient method for maintaining timing between recording devices. For example, each of the recording devices includes an interface that communicates with the external timing devices. The interface can be, for example, a serial pin connector. The external timing devices can also be burdensome to users of the recording devices. For example, the users must ensure that each of the recording devices is attached to an external timing device to ensure that the proper time is maintained in each recording device. Using external timing devices also adds to the amount of equipment that must be maintained. For example, in addition to each of the recording devices, an external timing device must be purchased and maintained for each recording device, thereby adding to equipment cost and maintenance.

FIG. 1 is a block diagram of a recording system in accordance with an illustrative embodiment. The recording system includes a recording device 100 and a timing source 125. The recording device 100 includes a sensor 105, a timing circuit 110, a processor 115, and a memory 120. In an illustrative embodiment, the sensor 105, the timing circuit 110, the processor 115, and the memory 120 are contained within a housing of the recording device 100. In alternative embodiments, additional, fewer, and/or different elements may be used.

The recording device 100 includes an integral timing circuit 110 that can maintain a constant clock pace. The sensor 105 can be used to receive content that is to be recorded. For example, the sensor 105 can be used to capture images, video, audio, etc. The memory 120 can be used to store the content with an indication of the time that the content was recorded.

For example, the recording device can be a video camera, and the sensor 105 can be used to capture sequential still images. The processor 115 can receive a still image from the sensor 105 and an indication of the time from the timing circuit 110. The processor 115 can cause the still image to be stored in the memory 120 with the indication of the time. In an illustrative embodiment, the still image is stored with a timestamp, such as HH:MM:SS:FF where "HH" is an indication of an hour, "MM" is an indication of a minute, "SS" is an indication of a second, and "FF" is an indication of a frame. For example, sequential timestamps can be 03:22:59:28; 03:22:59:29; 03:23:00:00; 03:23:00:01. In alternative embodiments, any suitable timestamp or indication of time can be used.

In an illustrative embodiment, a recording system can include multiple recording devices 100 that each store recorded content with an indication of the time that the content was recorded. In such a system, the time kept by the timing circuit 110 can be the same. For example, content recorded from the multiple recording devices 100 at an instance of time can store the content with a timestamp of 01:47:12:14. In such a system, each of the timing circuits 110 maintain the same timing without the timing pace drifting over time. That is, each of the timing circuits 110 that indicate a first specific time at a first instance (e.g., corresponding to a timestamp of 01:47:12:14) will indicate a second specific time at a second instance (e.g., two hours later corresponding to a timestamp of 03:47:12:14). In some embodiments, the accuracy is one-half frame per working shift period, such as 8 hours, 8.5 hours, 12 hours, etc. In an alternative embodiment, the accuracy is less than 0.5 frames per 24 hours. In an illustrative embodiment, the timing circuit 110 can use a phase-locked loop (PLL) and an oscillating crystal to maintain a constant clock signal pace.

In such an embodiment, each of the timing circuits can receive a current time from a timing source 125. In some embodiments, each of the recording devices 100 receive a current time simultaneously. In alternative embodiments, each of the recording devices 100 receive a current time independently from one another.

The timing source 125 can be any suitable source that maintains a consistent time clock or synchronizing waveform. As illustrated in FIG. 1 with a dashed line, the timing source 125 can be selectively removed from the recording device 100. The timing source 125 can be communicatively connected to the timing circuit 110 via any suitable connection, such as a serial pin connection, a jack plug connection, a wireless connection, etc. The timing source 125 can communicate with the timing circuit 110 to synchronize the timing circuit 110 with the timing source 125. In an illustrative embodiment, the timing source 125 can be used to set the time of the timing circuit 110 of a first recording device 100, disconnected from the first recording device 100, and connected to a second recording device 100 to set the time of the corresponding timing circuit 110. In an illustrative embodiment, the timing source 125 is based on a linear timecode composed of 80 bits per frame. If, for example, the frame rate is set to 30 frames-per-second and each time code is represented by an 80-bit value, the linear timecode provides for a 2.4 kHz bit-stream. The recording device 100 may synchronize its timing circuit to the supplied linear-timecode bit stream. Alternatively, the timing source that may be based on a 48 kHz WCLK (e.g., based on the audio sampling) or 10 MHz reference signal that the recording device 100 may use to synchronize its timing circuit 110 to. Alternatively, additional external timing sources may serve as a timing source 125 in providing a synchronizing source.

Figure 2:
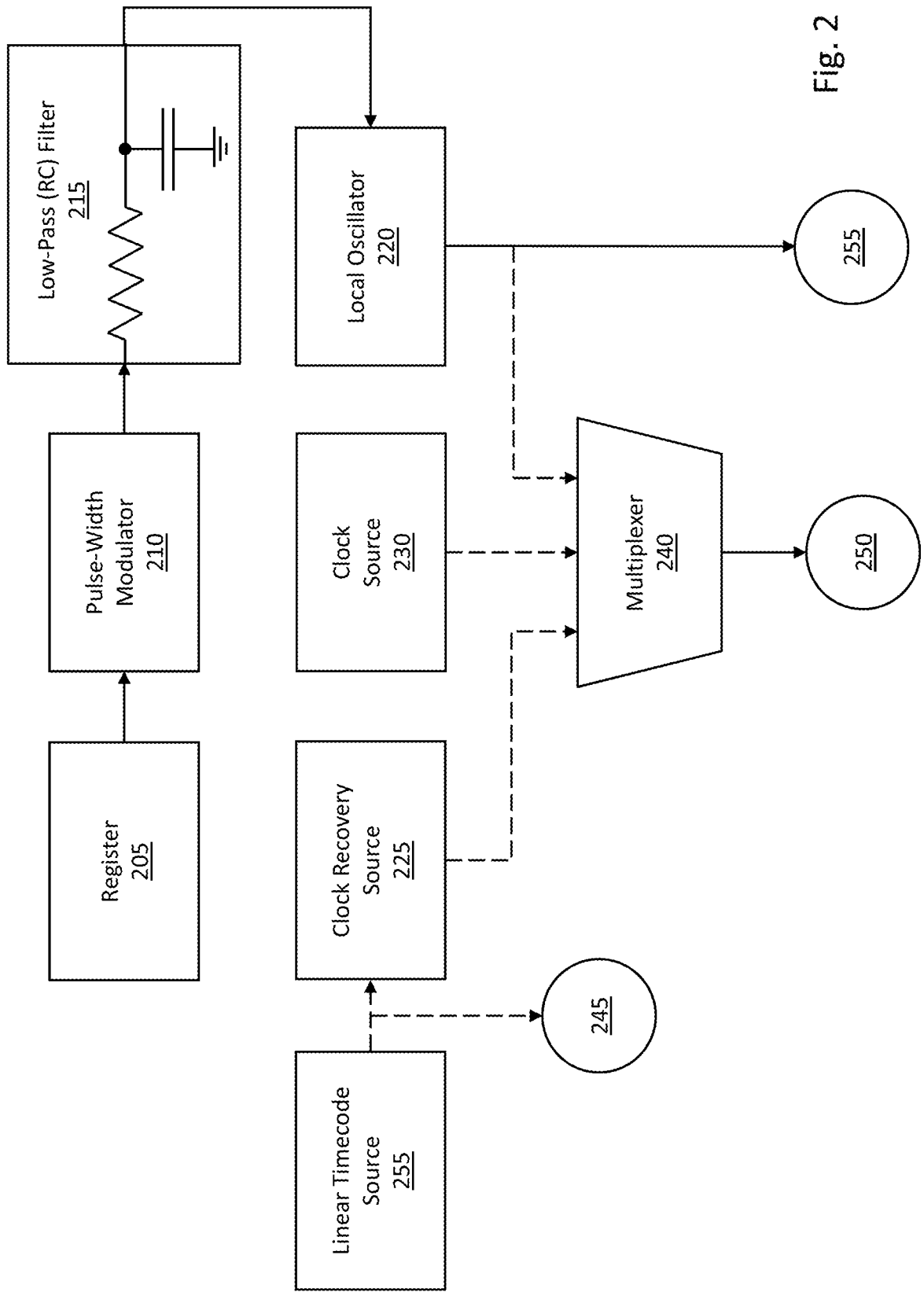
FIG. 2 is a block diagram of multiplexer circuit for selecting a phase-locked loop input in accordance with an illustrative embodiment.

FIG. 2 is a block diagram of multiplexer circuit for selecting a phase-locked loop input in accordance with an illustrative embodiment. The block diagram of FIG. 2 includes a register 205, a pulse-width modulator 210, a low pass filter 215, a linear time code source 255, a clock recovery source 225, a clock source 230, a local oscillator 220, and a multiplexer 240. In some embodiments, the low pass filter 215 may be based on a resistor/capacitor (RC) low-pass network. In alternative embodiments, additional, fewer, and/or different elements can be used. In an illustrative embodiment, the block diagram of FIG. 2 comprises a portion of the timing circuit 110. Dashed lines in FIG. 2 represent connections that may be established and then later disconnected in some embodiments.

The block diagram includes the register 205. The register 205 is a memory register location that is used to store a time value, pulse-width modulation (PWM) duty factor, rate, or other control value (hereafter referred to as "rate control value") used to control the PWM generated output of pulse width modulator 210 or other means to control the output frequency of the local oscillator 220. In an illustrative embodiment, a processor used by the recording device 110 (e.g., the processor 115) writes the current rate control value to the register 205.

The rate control value stored in the register 205 can be read by the pulse-width modulator 210. The pulse-width modulator 210 can be implemented in any suitable manner, such as via an integrated circuit. The pulse-width modulator 210 can convert the rate control value read from the register 205 into a digital signal that depends on the value such that when the output is low-pass filtered and supplied as an input to a local oscillator 220, the local oscillator provides an output at close to 38.4 MHz, but at an exact rate that may be custom tuned by the rate control value written to register 205. The output of the local oscillator 220, the output of the clock source 230, and the output of the clock recovery source 225 can be input to the multiplexer 240 and selected by the multiplexer 240 to be output 250 by multiplexer 240.

As shown in FIG. 2, the connection between the pulse-width modulator 210 and the local oscillator 220 can include a low-pass filter 215 for extracting the low frequency (or DC) component present in the output of the pulse width modulator 210. In some embodiments, the low-pass filter 215 is based on a simple RC low-pass network (e.g., as shown in FIG. 2). Any suitable resistor and capacitor can be used in the low pass filter 215 such that the low-pass filter 215 extract the low frequency (e.g., direct current) component with sufficient stability to be used in tuning the output frequency of the local oscillator 220. In some embodiments, a resistor and/or capacitor are not used, but other circuits may provide for low-pass filtering of the output of the pulse width modulator 210.

The clock recovery source 225 can utilize any suitable linear input timecode signal (or encoding of Society of Motion Picture & Television Engineers (SMPTE) data) and outputs a clock representative for the bit-rate of the incoming linear time code signal. In an illustrative embodiment, the clock recovery source 225 is the timing source 125. The clock recovery source 225 can be selectively communicatively coupled or uncoupled to the multiplexer 240.

The clock source 230 transmits to the multiplexer 240 a time signal (or timing waveform). In an illustrative embodiment, the time signal from the clock source 230 can be any suitable external source of a time signal, such as a 48 kHz Word Clock (WCLK) used by another audio recording device or a 10 mega Hertz (MHz) reference signal. For example, the 10 MHz reference signal can be a precise oscillating signal, such as a 10 MHz signal used to synchronize satellites. The clock source 230 can be selectively communicatively coupled or uncoupled to the multiplexer 240.

The multiplexer 240 can select one of the three inputs to pass on to be the first reference signal 250. In an illustrative embodiment, as long as an external time signal (e.g., either from the clock recovery source 225 or from the clock source 230) is received, the multiplexer 240 passes the received signal to be the first reference signal 250. In an alternative embodiment, the multiplexer 240 passes the received external time signal for a fixed, predetermined period of time. When an external time signal is not received by the multiplexer 240 (e.g., because the linear timecode source 225 and the clock source 230 are disconnected), the multiplexer 240 passes the signal received from the local oscillator 220.

Figure 3A:
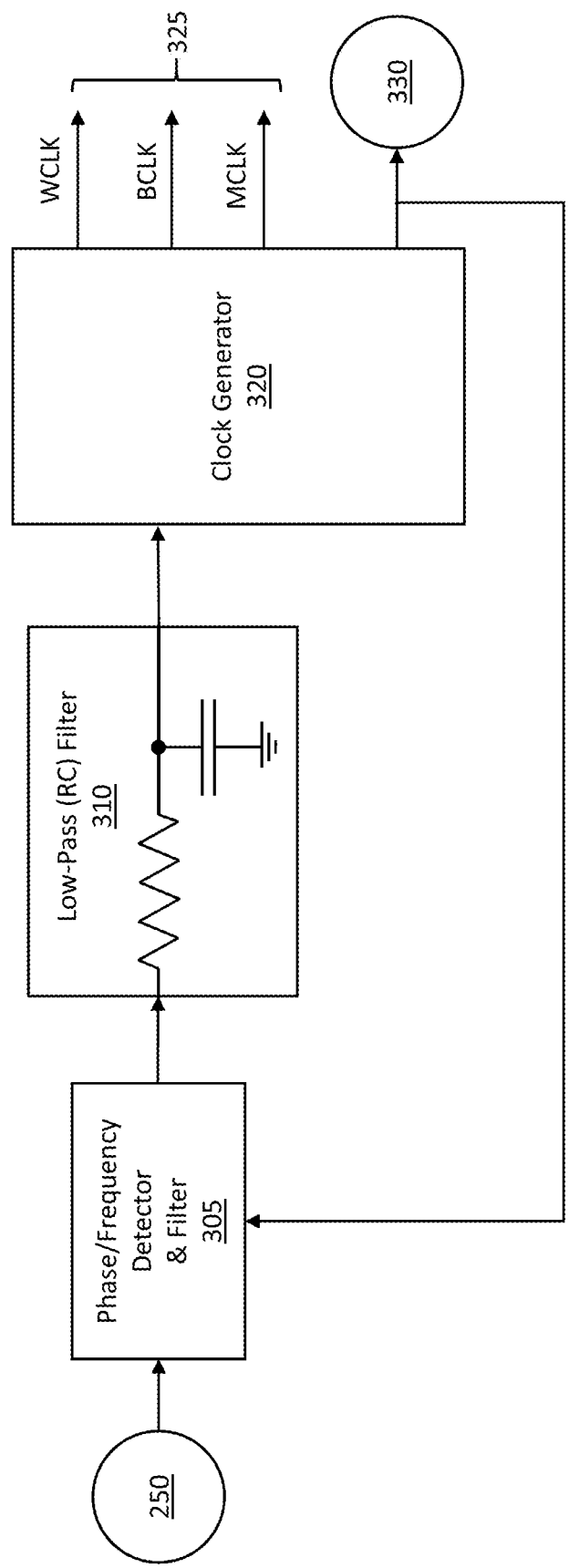
FIG. 3A is a block diagram of a phase-locked loop circuit in accordance with an illustrative embodiment.

FIG. 3A is a block diagram of a phase-locked loop circuit in accordance with an illustrative embodiment. The block diagram of FIG. 3A includes a phase/frequency detector and filter 305, a low-pass filter 310, and a clock generator 320. In alternative embodiments, additional, fewer, and/or different elements can be used.

The clock generator 320 outputs clock signals 325 and a second reference signal 330. In an illustrative embodiment, the clock signals 325 and the second reference signal 330 are generated based on the same controlling input signal and are synchronized or interdependent. For example, the clock generator 320 can include a voltage controlled crystal oscillator that generates an oscillating electrical signal. In an illustrative embodiment, the clock generator 320 is a programmable clock generator such as the model Si5351B I$^2$C configurable clock generator produced by Silicon Labs.

Figure 3B:
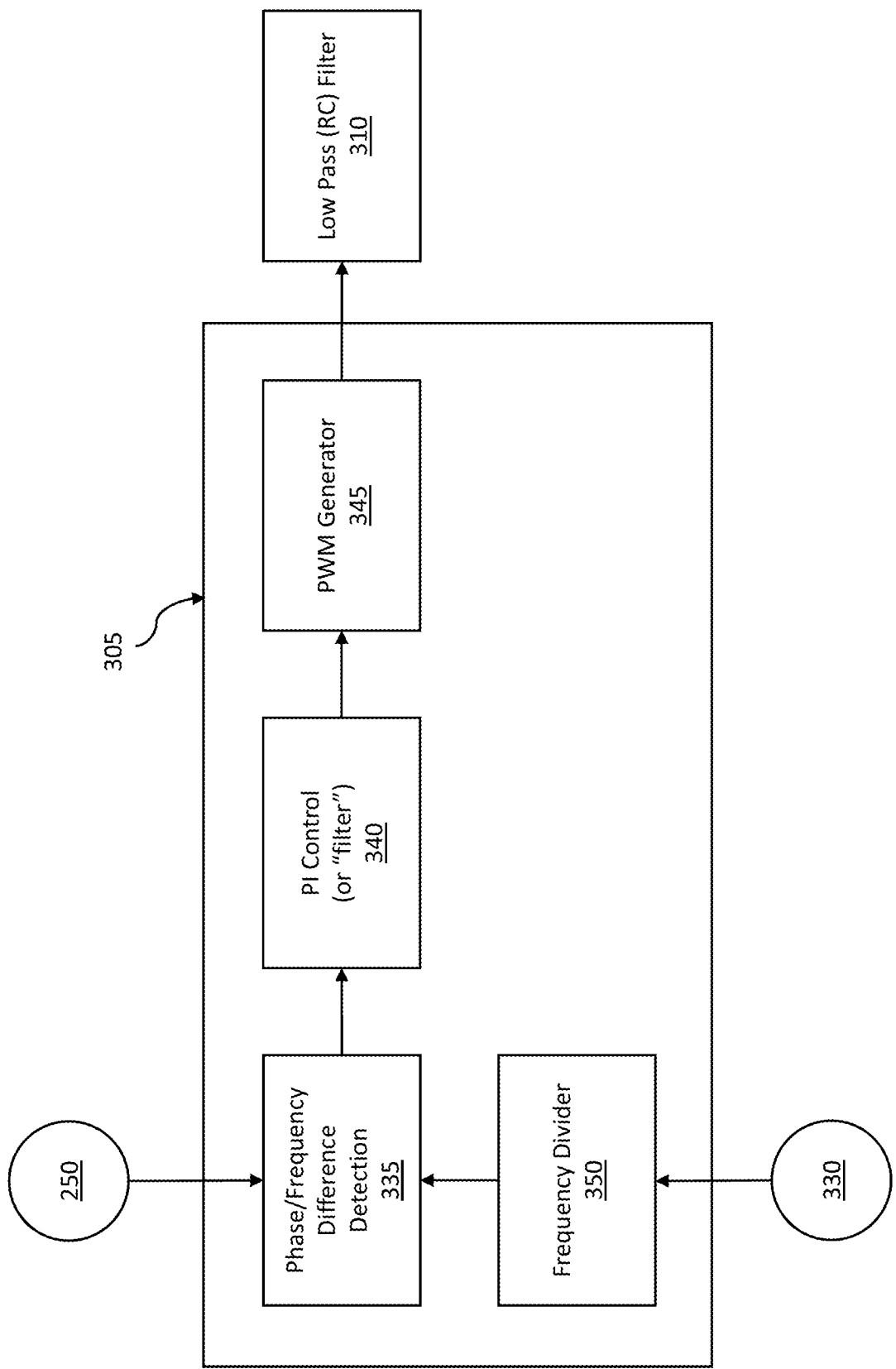
FIG. 3B is a block diagram for a phase/frequency detector and filter component used as part of a phase-locked loop circuit in accordance with an illustrative embodiment.

The phase/frequency detector and filter 305 is shown in greater detail in FIG. 3B according to an illustrative embodiment. In the embodiment shown in FIG. 3B, the phase/frequency detector and filter 305 passes the second reference signal 330 through a frequency divider 350 to produce a frequency-divided second reference signal. For example, the first reference signal 250 runs at 48 kHz and the second reference 330 signal runs at 38.4 MHz. The ratio between the first reference signal 250 and the second reference signal 330 is 800, and the ratio is used for the frequency divider 350. The phase/frequency detector and filter 305 compares the phase of the first reference signal 250 and the phase of the frequency-divided second reference signal at a phase/frequency difference detection circuit 335 to produce a phase error. In alternative embodiments, the phase/frequency difference detection circuit 335 compares the frequency of the first reference signal 250 with the frequency of the frequency-divided second reference signal to produce a frequency error. The output of the phase/frequency detection circuit is applied as the input to a proportional-integral (PI) controller or other appropriate filter (or combination of them) to produce a PLL duty factor signal. The duty factor signalcan be applied as an input to a PWM generator 345, which is output from the phase/frequency detector and filter 305.

The phase/frequency detector and filter 305 may also internally contain counting registers designed to obtain the frequency for each reference by digitally counting transitions (e.g., a rise or fall of a digital signal) over a period of time and using the difference of the counts to adjust the frequency of the second reference output 330. For example, in an illustrative embodiment, once the two frequencies are close or the detected frequency ratio is close to a desired value, the digital difference signal (e.g., the detected difference in signal transitions over a period of time or the difference in timing between transitions) may become quantized (e.g. a series of integer differences such as +1, −1, +1, −1, +2, −1, +1, . . . ). Alternatively, the phase between the two reference signals may be used by digitally comparing the sign or value of each and comparing. An additional filter internal to the phase/frequency detector and filter 305 may be applied to smooth the resultant difference signal before the difference signal is passed as an input signal to a proportional-integral (PI) controller that is used to drive the output duty factor for the programmable output PWM voltage waveform.

The PWM output waveform from the phase/frequency detector and filter 305 may be supplied as an input to the low-pass filter 310, where the low frequency (or DC)

component is extracted based on the duty factor present in the PWM output waveform. The output of the phase/frequency detector and filter 305 may be used as a control input for fine-tuning the phase and/or frequency of the clock generator 320. This forms a controllable feedback loop with the difference in phase and/or frequency between the first reference signal 250 and second reference signal 330 being fed back to the phase/frequency detector 305, allowing for the loop to fine-tune and "lock" the phase and/or frequency of the second reference 330 (or frequency-divided second reference signal) to that for the first reference input 250.

In an illustrative embodiment, the magnitude of the positive voltage output from low pass filter 310 that serves as the input to the clock generator 320 varies based on the amount of which the phases of the first reference signal 250 and the second reference signal 330 are out of phase. For example, if the phase of the first reference signal 250 is ahead of the phase of the second reference signal 330, the output voltage supplied to the clock generator 320 may increase. Similarly, if the phase of the first reference signal 250 is behind the phase of the second reference signal 330, the output of the low pass filter 310 may decrease. Although a PI controller may be used to determine the increase or decrease in voltage, other feedback methods exist that may also be used to achieve a "lock." In an illustrative embodiment, the phase/frequency detector and filter 305 includes a freewheeling function that allows for the phase-locked-loop to continue to function when the first reference signal 250 being supplied by the output of multiplexer 240 is interrupted (e.g., due to switching from one input source of the multiplexer 240 to another).

The input of the clock generator 320 is used by the clock generator 320 to advance or retard the phase (or frequency) of the clock signals 325 and the second reference signal 330. For example, if the voltage input to the clock generator 320 increases, the clock generator 320 advances the phase (or frequency) of the second reference signal 330 compared to the first reference signal 250. If the voltage input to the clock generator 320 is decreased, the clock generator 320 retards the phase of the second reference signal 330 compared to the first reference signal 250. Thus, the phase-locked loop circuit of FIG. 3A can be used to output a clock signal 330 that tracks the phase and frequency of the first reference signal 250. In such a manner the same clock pace as provided as an input (e.g., the first reference signal 250) to the PLL can be accurately maintained over long periods of time.

In a manner similar to that just described in the preceding paragraph, the PLL may be configured to track the phase and frequency for the clock recovery source 225, the clock source 230, or the linear time-code source 255 of local oscillator 220, depending on the selection made by the multiplexor 240 of FIG. 2. In each case, the ratio used by the frequency divider 350 depends on the selection.

In an illustrative embodiment, the clock generator 320 outputs the clock signals 325 to be used as clock input signals for various components of the recording device 100 (e.g., the processor 115, the memory 120, the sensor 105, etc.). Although FIG. 3A shows three clock signals 325, in alternative embodiments, the clock generator 320 can output fewer or greater than three clock signals 325. In an illustrative embodiment, the clock generator may output an audio sample rate clock (WCLK) that runs at the sample rate for recorded audio (e.g. 44.1 kHz, 48 kHz, 96 kHz, 192 kHz), an audio bit clock (BCLK) that runs at 32 times WCLK, and a multiple for the sample rate clock (MCLK) that may run at, for example, 128, 256 or 512 times the rate of WCLK.

The MCLK may be useful for other features present in the recording device. In an illustrative embodiment, all of the clocks and the second reference signal 330 at 38.4 MHz are generated from a common source in the clock generator 320.

Figure 4:
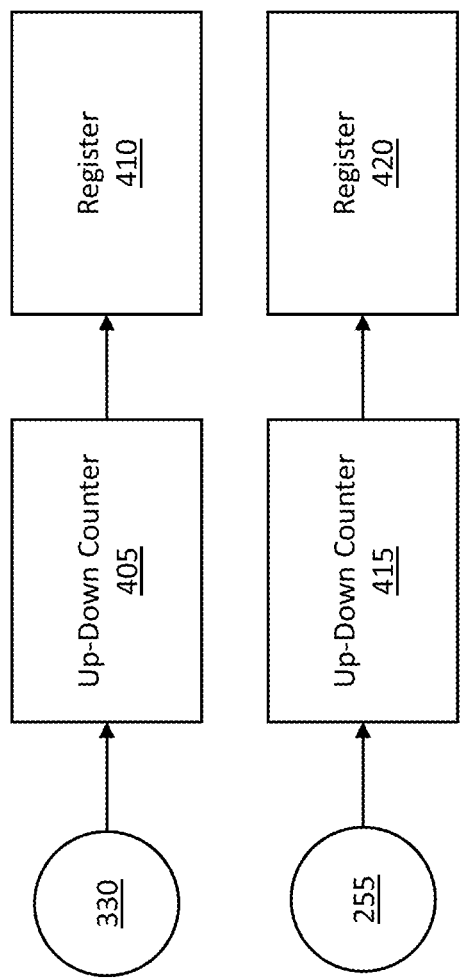
FIG. 4 is a block diagram of a frequency measurement circuit in accordance with an illustrative embodiment.

FIG. 4 is a block diagram of a frequency measurement circuit in accordance with an illustrative embodiment. In alternative embodiments, additional, fewer, and/or different elements can be used. The circuits of FIG. 4 may be used for fine-tuning the rate control value written to register 205, which is used to control the pulse width modulator 210 (and, subsequently, the frequency for the output of the local oscillator 220) of FIG. 2. The first up-down counter 405 is supplied with the second reference signal 330 (e.g., at 38.4 MHz) from the clock generator 320, and the second up-down counter 415 is supplied with the linear time-code source 255 (e.g., at 38.4 MHz) from the output of the local oscillator 220 of FIG. 2. The circuit of FIG. 4 operates by placing the value of the first up-down counter 405 into register 410 and the value of the second up-down counter 415 into register 420 after the first up-down counter 410 and the second up-down counter 415 are allowed to run over a fixed amount of time. The processor 115 can then compute the difference between the frequencies of the second reference signal 330 and the linear time-code source 255 and correspondingly fine-tune the rate control value written to register 205 that is used to adjust the frequency of the linear time-code source 255 until the linear time-code source 255 matches the second reference signal 330. This procedure may take multiple iterations performed over several seconds. Once a frequency match has been obtained, the resultant value written to register 205 may be saved.

Figure 5:
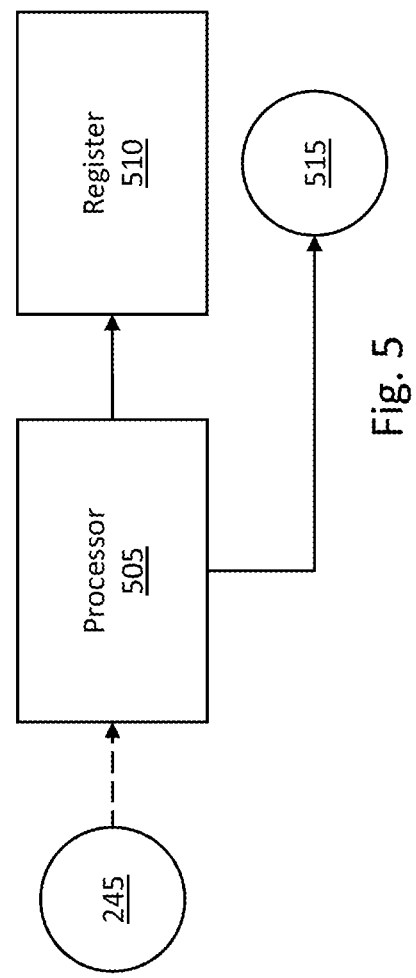
FIG. 5 is a block diagram of a circuit for extracting linear time code timing and/or information in accordance with an illustrative embodiment.

FIG. 5 is a block diagram of a circuit for extracting linear time code timing and/or information in accordance with an illustrative embodiment. The circuit of FIG. 5 includes a processor 505 and a register 510. In alternative embodiments, additional, fewer, and/or different elements may be used. The dashed line in FIG. 5 represents a connection that may be established and then later disconnected.

In an illustrative embodiment, the processor 505 is a processor of a recording device (e.g., the processor 115). In an alternative embodiment, the processor 505 can be implemented using a dedicated circuit. A clock signal can be received by the processor 505, such as a linear time-code (LTC) signal. The processor 505 determines the time from the clock signal and writes the time to the register 510. Although the register 510 is shown as a single register in FIG. 5, any suitable number of registers can be used. For example, the register 510 can be two registers, three registers, etc. In an illustrative embodiment, the register 510 is a memory register of the memory 120. In an illustrative embodiment, while the processor 505 is connected to an external LTC, the processor 505 can read the 80 bits of data provided per frame to determine the capture rate and retrieve timing information regarding the exact moments frames are received. Once the recording device 100 has been synchronized, the processor 505 may continue to generate timing information based on an internally generated (and synchronized) clock signal from within the recording device 100. For example, the processor 505 can determine the frames per second to be captured by a video recorder. The processor 505 outputs a capture rate signal 515 to be used (e.g., by the processor 115) to set a capture rate and may generate a timing interrupt for each succeeding frame in the recording device 100.

Figure 6:
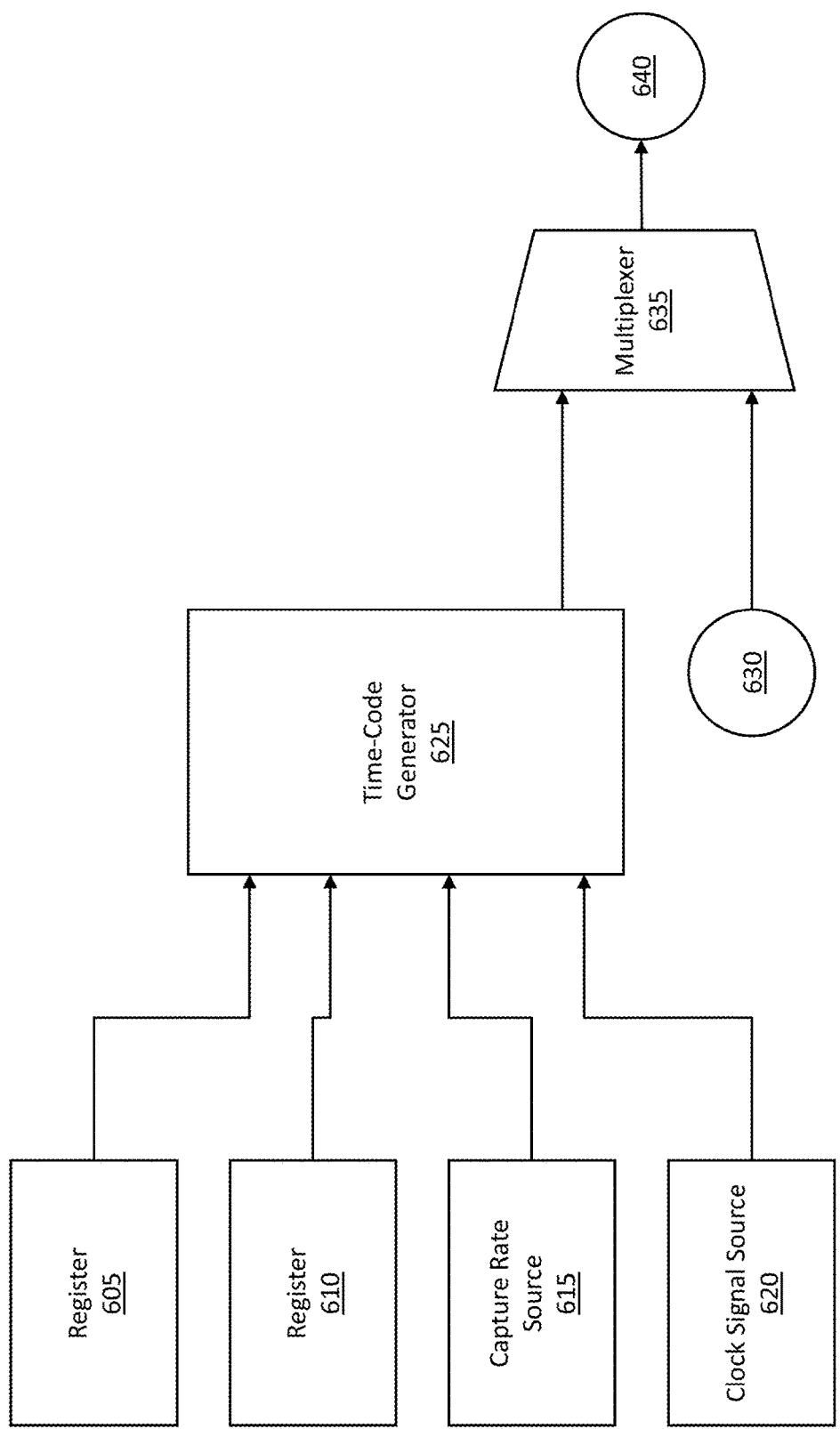
FIG. 6 is a block diagram of an output time signal multiplexer circuit in accordance with an illustrative embodiment.

FIG. 6 is a block diagram of an output time signal multiplexer circuit in accordance with an illustrative embodiment. The block diagram of the output time signal multiplexer circuit of FIG. 6 includes a register 605, a register 610, a capture rate source 615, a clock signal source 620, a timecode generator 625, and a multiplexer 635. In alternative embodiments, additional, fewer, and/or different elements may be used.

The register 605 and the register 610 are memory registers in a recording device (e.g., in the memory 120). Although FIG. 6 shows two registers, any suitable number of registers can be used. For example, one register may be used to store time code itself, while another may be used to store a 32-bit user code. For example, the register 605 and the register 610 can be the register 510. The capture rate source 615 provides an indication of the capture rate of the recording device 100 and may provide a frame start indicator waveform. In an illustrative embodiment, the capture rate source 615 is from the circuit illustrated in FIG. 5. For example, the capture rate signal 515 can be transmitted to the timecode generator 625. Alternatively, the capture rate signal 515 may be derived by the processor 115 based on output from the clock signal 320 also providing a clock source 620 to the timecode generator 625. In an illustrative embodiment, the clock signal source 620 includes the circuit shown in FIG. 3A. In another example, once phase lock is achieved, the second reference signal 330 (at, for example, 38.4 MHz) can also be sent as a clock source 620 to the timecode generator 625.

The timecode generator 625 can create a linear time-code (LTC) signal based on the information received from the register 605, the register 610, the capture rate source 615, and the clock signal source 620. In an illustrative embodiment, the timecode generator 625 can be implemented using a processor of the recording device 100 (e.g., the processor 115). In an alternative embodiment, the timecode generator 625 is implemented using a dedicated circuit. The LTC signal is output from the timecode generator 625 to the multiplexer 635.

The multiplexer 635 receives the LTC signal from the timecode generator 625 and receives a second timecode signal 630. In an illustrative embodiment, the second timecode signal 630 is a word clock (WCLK) signal. The multiplexer 635 determines an output 640 that is transmitted. This output may be made available to other external devices via an output connector of the recording device.

Figure 7:
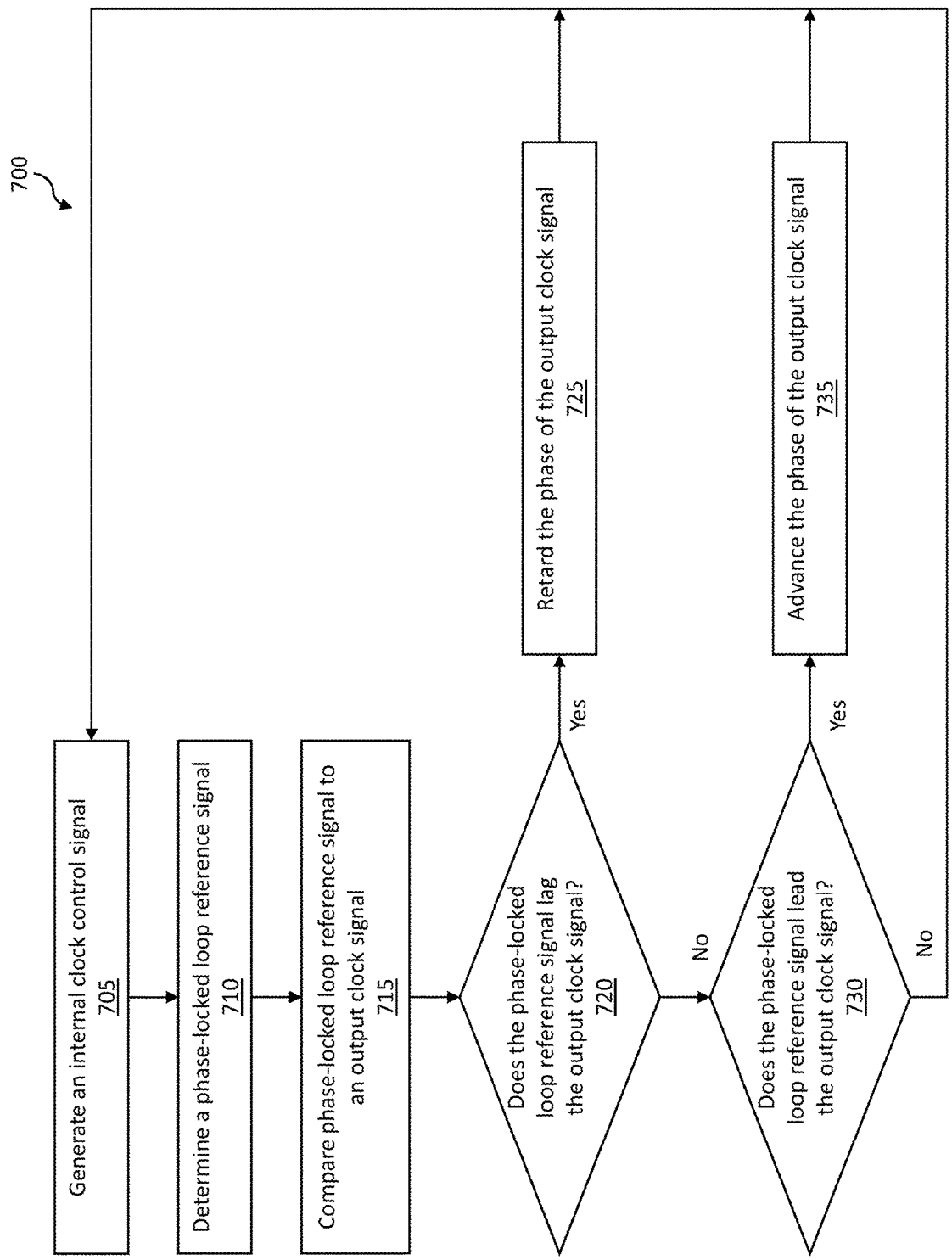
FIG. 7 is a flow chart of a method for tracking and maintaining a constant clock pace in accordance with an illustrative embodiment.

FIG. 7 is a flow chart of a method for tracking and maintaining a constant clock pace in accordance with an illustrative embodiment. In alternative embodiments, additional, fewer, and/or different elements may be used. Also, the use of a flow chart and arrows is not meant to be limiting with respect to the order of operations or flow of information. For example, in an illustrative embodiment, one or more operations are performed simultaneously.

In an operation 705, an internal clock control signal is generated. In an illustrative embodiment, the internal clock control signal is the output of the phase/frequency detector and filter 305. In an operation 710, a phase-locked loop reference signal is determined. In an illustrative embodiment, the phase-locked loop reference signal is determined by selecting one of the internal clock signals that was generated, a clock signal (e.g., from the clock source 230), or a clock recovery signal (e.g., from the clock recovery source 225). In an illustrative embodiment, the operation 710 is performed by the multiplexer 240.

In an operation 715, the phase-locked loop reference signal is compared to an output clock signal. In an illustrative embodiment, the output clock signal is a clock signal output from a clock signal generator (e.g., the clock generator 320). In an operation 720 it is determined whether the phase-locked loop reference signal lags the phase of the output clock signal. If yes, then the phase of the output clock signal is retarded (e.g., the pace of the oscillating output of the clock generator 320 is increased). If no, then in an operation 730 it is determined whether the phase-locked loop reference signal leads the phase of the output clock signal. If yes, then the phase of the output clock signal is advanced (e.g., the pace of the oscillating output of the clock generator 320 is decreased). If no, then the phase-locked loop reference signal and the output clock signal are in phase with one another, and the phase of the output clock signal is not modified. As shown in the flow diagram, the method 700 returns to the operation 705. A similar approach to the preceding description may also be used to achieve a phase locked loop operating on the basis of comparing frequency rather than phase or a combination of the two.

Figure 8:
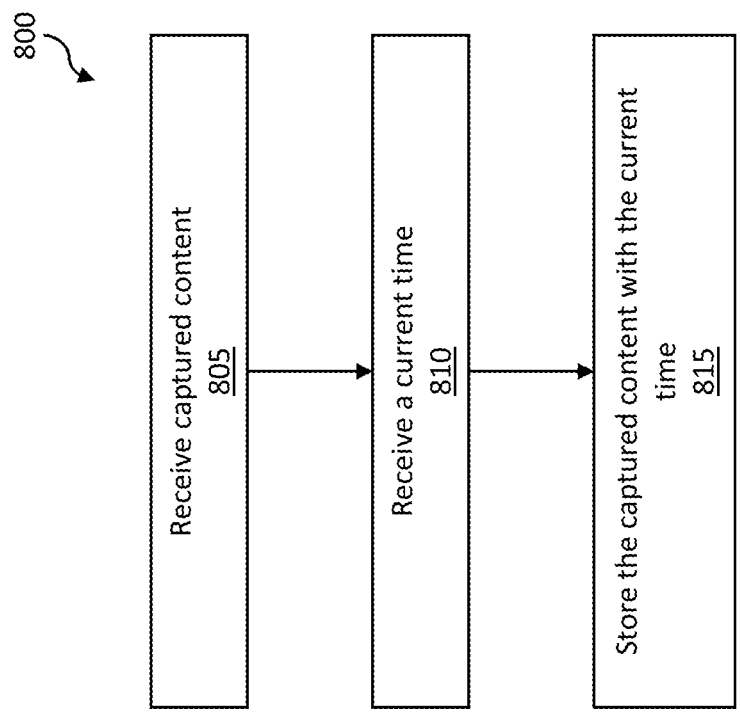
FIG. 8 is a flow chart of a method for recording content in accordance with an illustrative embodiment.

FIG. 8 is a flow chart of a method for recording content in accordance with an illustrative embodiment. In alternative embodiments, additional, fewer, and/or different elements may be used. Also, the use of a flow chart and arrows is not meant to be limiting with respect to the order of operations or flow of information. For example, in an illustrative embodiment, one or more operations are performed simultaneously.

In an operation 805, captured content is received. In an illustrative embodiment, the processor 115 receives the captured content from the sensor 105. For example, the processor 115 receives an image captured by a video camera. In another example, the processor 115 receives an audio sample from a microphone.

In an operation 810, a current time is received. In an illustrative embodiment, the processor 115 receives an indication of the current time from the timing circuit 110. For example, the processor 115 can receive the output 640 from the multiplexer 635. In an illustrative embodiment, the output 640 includes an indication of a reference hour, minute, second, and/or frame.

In an operation 815, the captured content is stored with the current time. In an illustrative embodiment, the captured content is stored in the memory 120 and is associated with a timestamp. The timestamp can be determined based on, for example, the current time indicated by the output 640.

Figure 9:
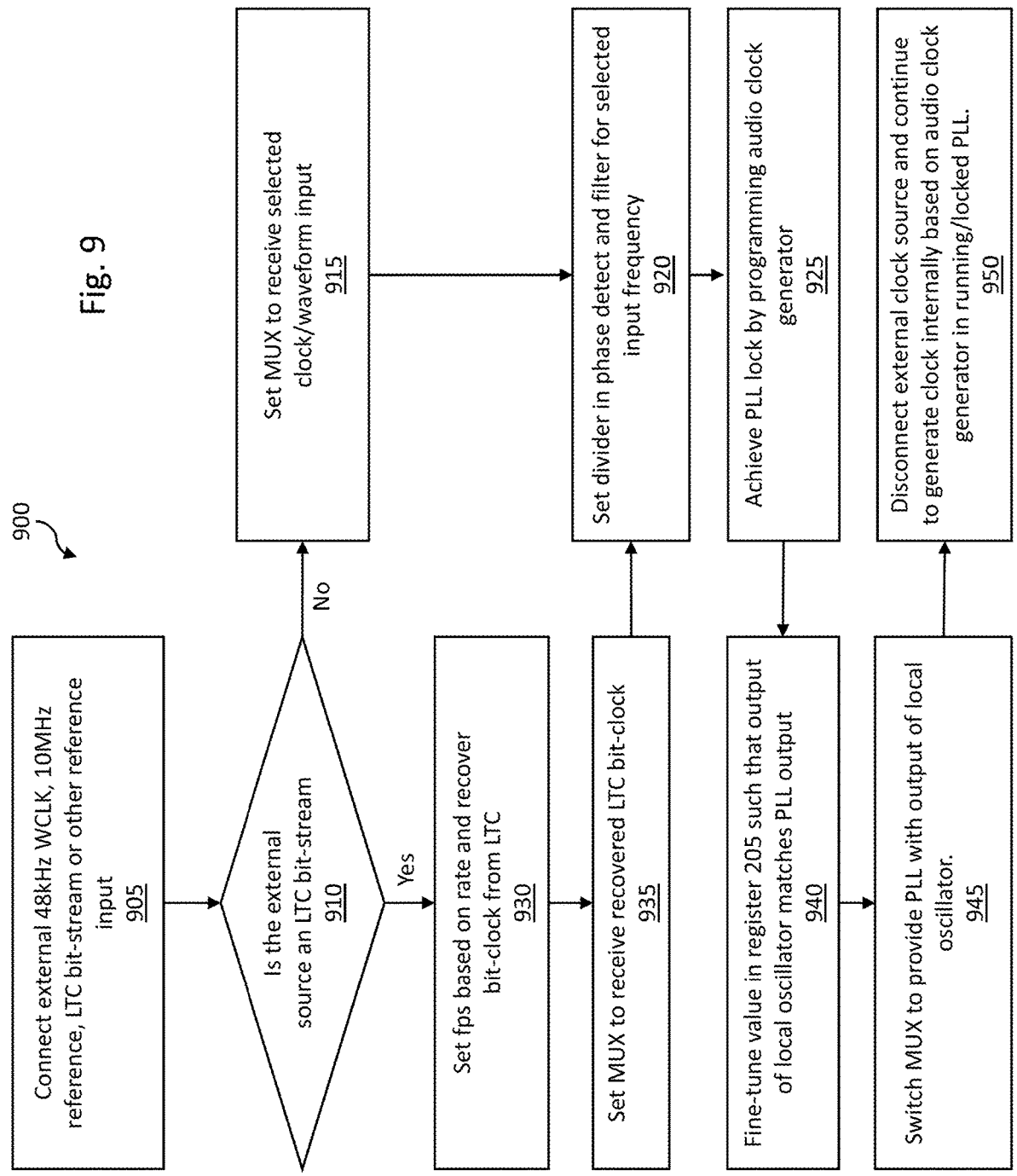
FIG. 9 is a flow chart of a method for synchronizing a system with an external clock source with an illustrative embodiment.

FIG. 9 is a flow chart of a method for synchronizing a system with an external clock source with an illustrative embodiment. The flow chart 900 shows a method of synchronizing the recording device 100 to an external device and calibrating the recording device 100 to internally generate a clock that will reliably track the timing of the external device, even after the external device has been detached from the recording device 100. In an operation 905, an external clock or LTC source is connected to the recording device 100. The external clock or LTC source can be used to synchronize the timing of the recording device 100 to the timing of the external clock or LTC source. In an operation 910, the recording device 100 determines (or is informed) whether the input reference is an LTC source (e.g., providing 80 bits per frame) or a clocking waveform such as a 48 k Hz WCLK, a 10 MHz reference, or other waveform.

If the input is an LTC source, the method 900 proceeds to an operation 930 in which the frames per second is set based on the bit rate and recover bit-clock from the LTC. The recording device 100 determines the bit rate for the incoming LTC bit-stream. Based on the detected rate, the frame rate is determined by dividing the number of bits per second by 80. For example, if 2.4 k bits per second is received, the frame rate is 2,400/80=30 frames per second (fps). Furthermore, at operation 930, the bit clocking is derived by analyzing the timing for bit transitions to generate a bit clock as a timing reference. In an operation 935, the multiplexer 240 is set to provide the clock recovery source 225 (or recovered 2.4 kHz bit-clock in the preceding 30 fps example) in FIG. 2 as a reference to the PLL input. In an illustrative embodiment, the clock source 230 remains disconnected.

If in the operation 910 it is determined that the external source is not the LTC bit-stream, in the operation 915 the multiplexer 240 is set to provide the selected waveform as an input to the PLL (e.g., provided by clock source 230 in FIG. 2) and the clock recovery source 225 of FIG. 2 remains disconnected.

Based on the frequency of the supplied waveform, in an operation 920 a divider is set in the phase/frequency detector and filter 305 of FIG. 3A (e.g., based on a 38.4 MHz reference). For example, if a 48 kHz WCLK is selected, the divider becomes 38,400,000/48,000=800. The PLL achieves lock at an operation 925 based on the selected frequency after being internally divided (e.g. 48 kHz from the WCLK example). In an operation 940, the up-down counter 405 of FIG. 4 is used to determine the frequency of the reference 330 being provided by the output of the PLL. In an illustrative embodiment, the frequency is based on a 38.4 MHz clock output from the clock generator 320. In a similar manner, the up-down counter 415 of FIG. 4 is used to determine the frequency for the linear time-code source 255 of the local oscillator 220. In an illustrative embodiment, the operation 925 also includes fine-tuning the output frequency of the local oscillator by changing the rate control value written to the register 205. In an illustrative embodiment, if the local oscillator 220 is running too fast, a rate control value is written register 205 to reduce the frequency, and if the local oscillator is running too slow, a rate control value 205 is written to register 205 to increase the frequency. In an illustrative embodiment, the operation 940 repeats, iterating until a match (or close enough for the desired accuracy specification) is achieved between the frequency (e.g., 38.4 MHz) of the local oscillator 220 and PLL output 330. In alternative embodiments, frequencies other than 38.4 MHz may also be used to achieve similar results, and the 38.4 MHz frequency should not be considered a limitation for the techniques provided by this disclosure.

In an illustrative embodiment, once a match is achieved, at an operation 945, the multiplexer 240 switches the first reference signal 250 over to the local oscillator 220 linear time-code source 255 and lock is maintained on the local oscillator linear time-code source 255. In an illustrative embodiment, during the operation 945 the recording device 100 is no longer relying on the external clock source 230 or linear time-code source 255 for the timing, and the external source may be disconnected at an operation 950. In an illustrative embodiment, the recording device 100 continues to operate in this mode having been synchronized to the desired external source generating timing signals internally.

Figure 10:
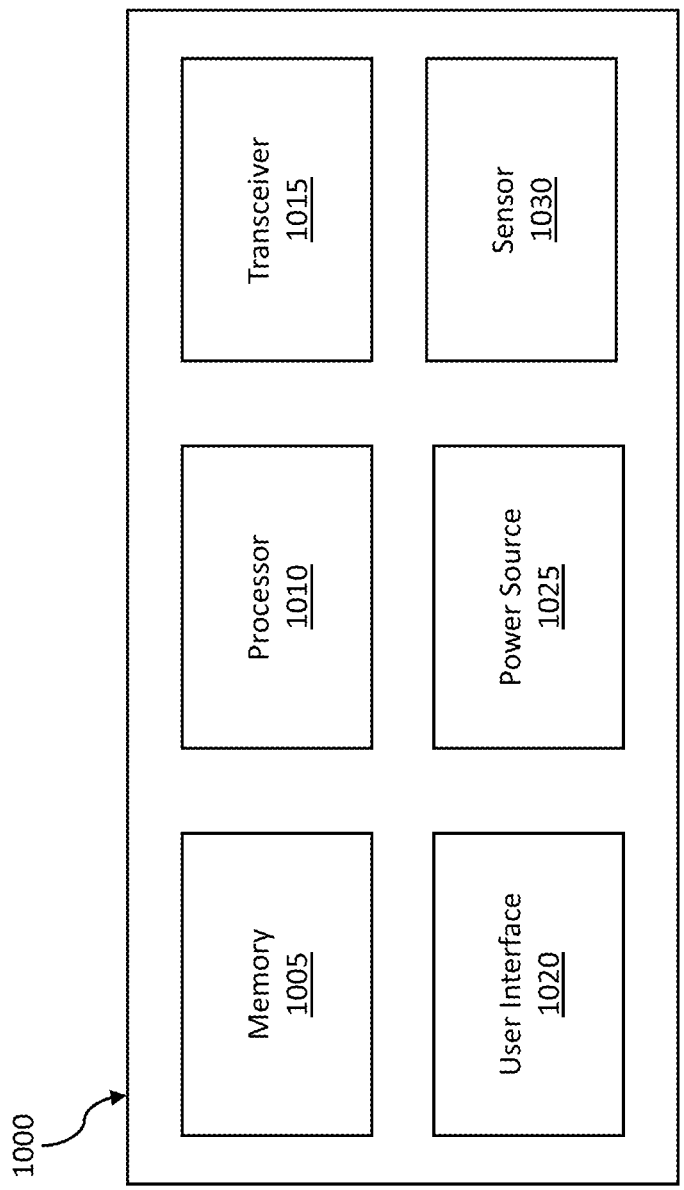
FIG. 10 is a block diagram of a computing device in accordance with an illustrative embodiment.

FIG. 10 is a block diagram of a computing device in accordance with an illustrative embodiment. An illustrative computing device 1000 includes a memory 1005, a processor 1010, a transceiver 1015, a user interface 1020, a power source 1025, and a sensor 1030. In alternative embodiments, additional, fewer, and/or different elements may be used. The computing device 1000 can be any suitable device described herein. For example, the computing device 1000 can be a video camera, a sound recording device, a desktop computer, a laptop computer, a smartphone, a specialized computing device, etc. The computing device 1000 can be used to implement one or more of the methods described herein.

In an illustrative embodiment, the memory 1005 is an electronic holding place or storage for information so that the information can be accessed by the processor 1010. The memory 1005 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 1000 may have one or more computer-readable media that use the same or a different memory media technology. The computing device 1000 may have one or more drives that support the loading of a memory medium such as a CD, a DVD, a flash memory card, etc.

In an illustrative embodiment, the processor 1010 executes instructions. The instructions may be carried out by a special purpose computer, logic circuits, or hardware circuits. The processor 1010 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 1010 executes an instruction, meaning that it performs the operations called for by that instruction. The processor 1010 operably couples with the user interface 1020, the transceiver 1015, the memory 1005, etc. to receive, to send, and to process information and to control the operations of the computing device 1000. The processor 1010 may retrieve a set of instructions from a permanent memory device such as a ROM device and copy the instructions in an executable form to a temporary memory device that is generally some form of RAM. An illustrative computing device 1000 may include a plurality of processors that use the same or a different processing technology. In an illustrative embodiment, the instructions may be stored in memory 1005.

In an illustrative embodiment, the transceiver 1015 is configured to receive and/or transmit information. In some embodiments, the transceiver 1015 communicates information via a wired connection, such as an Ethernet connection, one or more twisted pair wires, coaxial cables, fiber optic cables, etc. In some embodiments, the transceiver 1015 communicates information via a wireless connection using microwaves, infrared waves, radio waves, spread spectrum technologies, satellites, etc. The transceiver 1015 can be configured to communicate with another device using cellular networks, local area networks, wide area networks, the Internet, etc. In some embodiments, one or more of the elements of the computing device 1000 communicate via wired or wireless communications. In some embodiments, the transceiver 1015 provides an interface for presenting information from the computing device 1000 to external systems, users, or memory. For example, the transceiver 1015 may include an interface to a display, a printer, a speaker, etc. In an illustrative embodiment, the transceiver 1015 may also include alarm/indicator lights, a network interface, a disk drive, a computer memory device, etc. In an illustrative embodiment, the transceiver 1015 can receive information from external systems, users, memory, etc.

In an illustrative embodiment, the user interface 1020 is configured to receive and/or provide information from/to a user. The user interface 1020 can be any suitable user interface. The user interface 1020 can be an interface for receiving user input and/or machine instructions for entry into the computing device 1000. The user interface 1020 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 1000. The user interface 1020 can be used to navigate menus, adjust options, adjust settings, adjust display, etc.

The user interface 1020 can be configured to provide an interface for presenting information from the computing device 1000 to external systems, users, memory, etc. For example, the user interface 1020 can include an interface for a display, a printer, a speaker, alarm/indicator lights, a network interface, a disk drive, a computer memory device, etc. The user interface 1020 can include a color display, a cathode-ray tube (CRT), a liquid crystal display (LCD), a plasma display, an organic light-emitting diode (OLED) display, etc.

In an illustrative embodiment, the power source 1025 is configured to provide electrical power to one or more elements of the computing device 1000. In some embodiments, the power source 1025 includes an alternating power source, such as available line voltage (e.g., 120 Volts alternating current at 60 Hertz in the United States). The power source 1025 can include one or more transformers, rectifiers, etc. to convert electrical power into power useable by the one or more elements of the computing device 1000, such as 1.5 Volts, 8 Volts, 12 Volts, 24 Volts, etc. The power source 1025 can include one or more batteries.

In an illustrative embodiment, the computing device 1000 includes a sensor 1030. The sensor 1030 can be configured to capture content such as images or audio. In some embodiments, the sensor 1030 can capture two-dimensional images. In other embodiments, the sensor 1030 can capture three-dimensional images. The sensor 1030 can be a still-image camera, a video camera, a microphone, an audio mixer/recorder, scientific instruments, or any suitable device that records information with a time code. In embodiments in which the sensor 1030 is a camera, the sensor 1030 can be configured to capture color images, black-and-white images, filtered images (e.g., a sepia filter, a color filter, a blurring filter, etc.), images captured through one or more lenses (e.g., a magnification lens, a wide angle lens, etc.), etc. In some embodiments, sensor 1030 (and/or processor 1010) can modify one or more image settings or features, such as color, contrast, brightness, white scale, saturation, sharpness, etc. In an illustrative embodiment, the sensor 1030 captures infrared images. In an illustrative embodiment in which the sensor 1030 is a microphone, the sensor 1030 can be configured to capture sound. The sensor 1030 can be configured to modify audio settings such as a level of bass, treble, stereo, etc. In another example, the sensor 1030 is a device attachable to a smartphone, tablet, etc. In yet another example, the sensor 1030 is a device integrated into a smartphone, tablet, etc.

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A recording device comprising:
    a sensor that senses a condition;
    memory that stores an indication of the condition and an indication of when the condition was sensed by the sensor;
    a timing circuit that receives an indication of an initializing time from a time keeping device; receives an indication of a timing pace; and maintains an updated current time based on the initializing time and the timing pace, wherein the timing circuit uses a phase-locked loop to maintain the updated current time via a reference oscillating signal regulated by a pulse-width modulator of the recording device during a time when the timekeeping device is not communicatively coupled to the recording device, wherein the pulse-width modulator regulates the reference oscillating signal based on a duty factor of an output signal of the pulse-width modulator, and wherein the pulse-width modulator determines the duty factor based on a value stored in a memory register; and
    a processor communicatively coupled to the sensor, the memory, and the timing circuit, wherein the processor receives from the sensor the indication of the condition; receives from the timing circuit an indication of the updated current time, wherein the indication of the updated current time corresponds to when the condition was sensed by the sensor; and causes the memory to store the indication of the condition and the indication of when the condition was sensed by the sensor.

2. The recording device of claim 1, wherein the indication of the initializing time is received from the timekeeping device that is temporarily communicatively coupled to the recording device, and wherein the timing circuit maintains the updated current time while the timekeeping device is not communicatively coupled to the recording device.

3. The recording device of claim 1, wherein the phase-locked loop:
    generates an oscillating clock signal;
    compares a phase of the oscillating clock signal to a phase of the reference oscillating signal; and
    advances or retards the phase of the oscillating clock signal based on the comparison such that the oscillating clock signal and the reference oscillating signal are in phase with one another.

4. The recording device of claim 3, wherein the reference oscillating signal is received from the timekeeping device that is temporarily communicatively coupled to the recording device.

5. The recording device of claim 4, wherein the capture rate of the recording device is an indication of a number of frames captured per second by the recording device or an indication of an audio sampling rate.

6. The recording device of claim 3, further comprising a timecode signal generator that:
    receives from a memory register a time code;
    receives an indication of a capture rate of the recording device;
    receives the oscillating clock signal; and
    determines the indication of when the condition was sensed based on the received time code, the capture rate, and the oscillating clock signal.

7. The recording device of claim 1, wherein the sensor senses the condition by capturing an image or detecting an audio signal.

8. A method comprising:
    receiving, by a recording device, an indication of an initializing time from a timekeeping device;
    receiving, by the recording device, an indication of a timing pace;
    regulating a reference oscillating signal via a pulse-width modulator of the recording device during a time when the timekeeping device is not communicatively coupled to the recording device, wherein said regulating the reference signal comprises determining a value stored in a memory register and altering a duty factor of a signal output from the pulse-width modulator based on the value stored in the memory register;
    maintaining, by the recording device, an updated current time based on the initializing time, the timing pace and the regulated reference oscillating signal;
    sensing, via a sensor of the recording device, a condition; and
    storing, in memory of the recording device, an indication of the condition and an associated indication of the updated current time, wherein the indication of the updated current time corresponds to when the condition was sensed by the sensor.

9. The method of claim 8, wherein the indication of the initializing time is received from the timekeeping device that is temporarily communicatively coupled to the recording device, and wherein said maintaining the updated current time is while the timekeeping device is not communicatively coupled to the recording device.

10. The method of claim 9, further comprising:
    generating an oscillating clock signal;
    comparing a phase of the oscillating clock signal to a phase of the reference oscillating signal; and
    advancing or retarding the phase of the oscillating clock signal based on the comparison such that the oscillating clock signal and the reference oscillating signal are in phase with one another.

11. The method of claim 10, further comprising receiving the reference signal from the timekeeping device that is temporarily communicatively coupled to the recording device.

12. The method of claim 10, further comprising:
    receiving from a memory register a time code;
    receiving an indication of a capture rate of the recording device; and determining the indication of when the condition was sensed based on the received time code, the capture rate, and the oscillating clock signal.

13. The method of claim 12, wherein the capture rate of the recording device is an indication of a number of frames captured per second by the recording device or an indication of an audio sampling rate.

14. The method of claim 8, wherein said maintaining the updated current time is via the phase-locked loop.

15. The method of claim 8, wherein said sensing the condition comprises capturing an image or detecting an audio signal.

* * * * *